United States Patent [19]

Scheinberg

[11] Patent Number: 4,739,282

[45] Date of Patent: Apr. 19, 1988

[54] CURRENT BLEEDER AMPLIFIER WITH POSITIVE FEEDBACK

[75] Inventor: Norman R. Scheinberg, South River, N.J.

[73] Assignee: Anadigics, Inc., Warren, N.J.

[21] Appl. No.: 887,217

[22] Filed: Jul. 21, 1986

[51] Int. Cl.[4] .......................... H03F 3/16; H03F 1/38
[52] U.S. Cl. ................................... 330/277; 330/291
[58] Field of Search ............... 330/277, 311, 278, 291

[56] References Cited

U.S. PATENT DOCUMENTS 4,525,679  6/1985  Wong et al. ..................... 330/277

Primary Examiner—Gene Wan
Attorney, Agent, or Firm—Richard C. Woodbridge

[57] ABSTRACT

An FET amplifier having a current bleeder includes a positive feedback path for increasing the overall gain of the device. The positive feedback path includes an additional FET having its drain source path connected to the current bleeder and its gate connected to the output of the amplifier. The positive feedback causes the current through the current bleeder to vary in direct response to the output of the amplifier, thereby significantly increasing its overall gain.

2 Claims, 3 Drawing Sheets

CURRENT BLEEDER AMPLIFIER WITH POSITIVE FEEDBACK

BACKGROUND OF THE INVENTION

1. Field of the Invention

The invention relates to an FET amplifier including a current bleeder and a positive feedback path for increasing the overall gain of the circuit.

2. Description of Relevant Art

Various different efforts have been made to improve the gain of FET like amplifiers. A representative summary of some of those efforts are described in the following U.S. Pat. Nos.: 3,961,279; 4,284,959; 4,336,503; 4,482,868 and 4,538,115. See also, IEEE Journal of Solid-State Circuits, Vol. SC-19, No. 6, December 1984 entitled DESIGN TECHNIQUES FOR CASCODED CMOS OP AMPS WITH IMPROVED PSRR AND COMMON-MODE INPUT RANGE.

A relevant article entitled "A Low Noise GaAS Monolithic Broad-Band Amplifier Using a Drain Current Saving Technique" is found in Vol. MTI-33, No. 6, June, 1985 edition of IEEE Transactions on Microwave Theory and Techniques at pages 543–545. The general topology of the circuit described therein has some similarity to the present invention even though the purpose and ultimate function of the circuit appear to be quite different.

FIGS. 1, 2 and 3 show relevant configurations for current bleeders. FIG. 3 essentially illustrates the optimum circuit for obtaining maximum gain through modern techniques. The present invention represents a substantial improvement in gain over such FET amplifiers.

SUMMARY OF THE INVENTION

Briefly described the invention comprises an improved FET amplifier. The gate of a first FET serves as the input to the amplifier. A second FET having its source connected to its gate is connected in series with the first FET through a third FET which has its gate connected to a fixed voltage reference. The output of the circuit is taken at the connection between the source of the second FET and the drain of the third FET. A fourth FET is preferably connected in parallel with the first FET such that the drains, gates and sources of both FET's are mutually connected together. A fifth FET having its gate connected to its source is connected between the drain of the first and fourth FET and the power supply terminal of the amplifier. The fifth FET provides the path for bleeder current that increases the gain of the amplifier. It is possible to still further increase the gain of the circuit by providing a positive feedback path between the amplifier output and the fifth FET. This is accomplished by connecting a sixth FET between the fifth FET and the power supply terminal. The gate of the sixth FET is connected to the output of the circuit so that the bleeder current through the fifth FET varies in response to the output voltage. This addition results in a significant increase in gain.

These and other features of the invention will be more fully understood by reference to the following drawings.

DETAILED DESCRIPTION OF THE INVENTION

During the course of this description like numbers will be used to designate like elements according to the different views that illustrate the invention.

Figure 1:
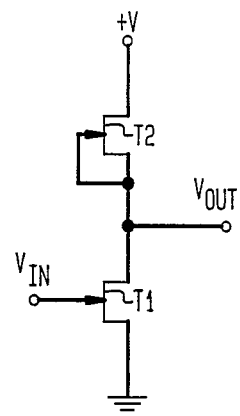
FIG. 1 is a prior art FET amplifier.

FIG. 1 illustrates a typical prior art FET amplifier. It is known that the gain of such a circuit is given by:

$$Gain = G_{m1}(R_{d1}//R_{d2})$$

where $$G_m = \frac{\Delta I_D}{\Delta V_{gs}}$$

is the transconductance of a FET and $R_d$ is the intrinsic drain resistance.

Figure 2:
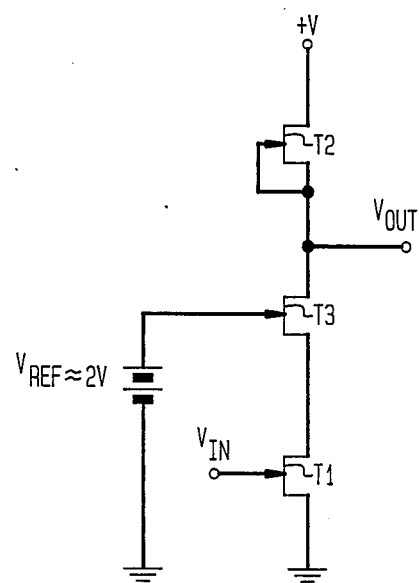
FIG. 2 is a prior art FET amplifier in which the gain of the circuit is increased by placing an additional FET in cascode with the other FET's.

The gain of the amplifier illustrated in FIG. 1 can be increased by using a cascode configuration as shown in FIG. 2. A third FET T3 is shown connected between the drain of FET T1 and the source of FET T2. The gate of FET T3 is connected to a fixed reference voltage $V_{ref}$ shown as being 2 volts in FIG. 2. $V_{ref}$ is preferably greater than 1.5 volts so that $V_{DS}$ of the first FET T1 is at least 1.5 volts thereby placing the first FET T1 in its saturation region. This assumes that the $V_{gs}$ of each FET is zero. By using standard art techniques it can be shown that the gain of FIG. 2 is given by $$Gain = G_{m1}(R_{d2}//R') = G_{m1}[R_{d2}//(R_{d1}(1+G_{m3}R_{d1})+R_{d3})]$$

For GaAs MESFET'S $G_m R_d \approx 15$ so the gain is
$Gain \approx G_{m1}[R_{d2}//(16R_d + R_{d3})]$. If $R_{d2} \approx R_{d1}$, the usual
case, then the gain of FIG. 2 is about:
$Gain \approx G_{m1}R_{d2}$, since $R_d//17R_d \approx R_d$ A mathematical analysis of cascode amplifiers is found on pages 191 through 193 of "Analysis and Design of Analog Integrated Circuits". 2nd Edition, by Gray and Meyer, John Wiley and Sons.

It is possible to still further increase the gain of the circuit in FIG. 2 by increasing $G_{m1}$ or $R_{d2}$. $G_{m1}$ can be increased by adding a fourth FET T4 in parallel with input FET T1. If T1 is identical in characteristics to T4, then the gain increase of the circuit can be given by:

$$Gain\ (2G_{m1}\ or\ 4)\ R_{d2}$$

Figure 4:
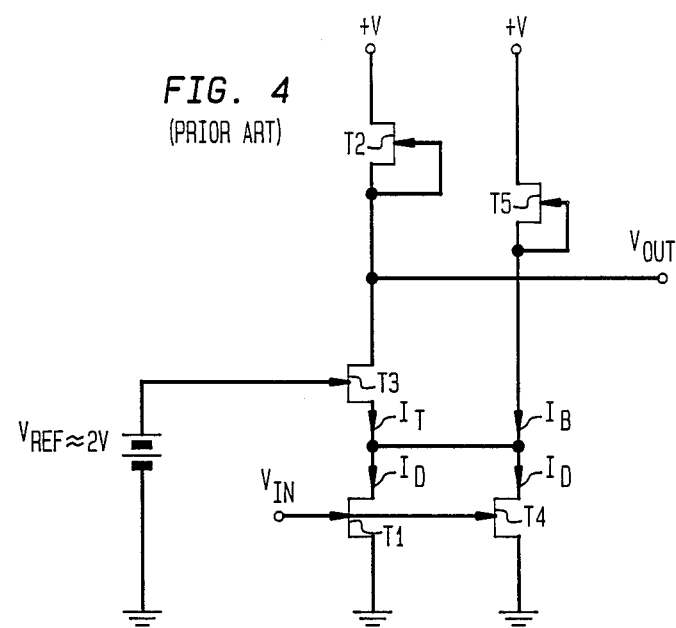
FIG. 4 illustrates the current bleeder technique for increasing the gain of an amplifier.
Figure 3:
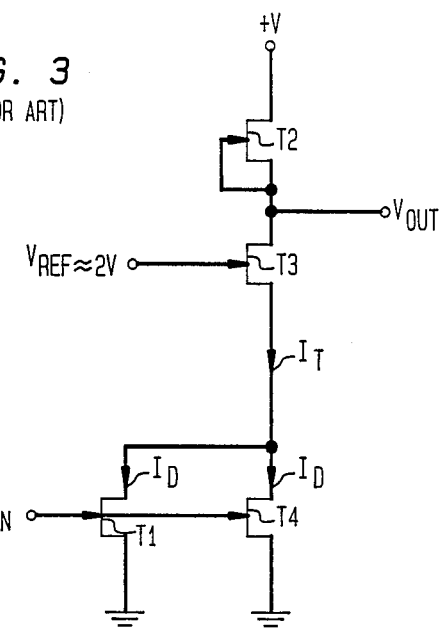
FIG. 3 illustrates a cascode FET amplifier including two FET's in parallel at the input thereof.

The gain $G_m$ of an FET is proportional to the current flowing through it. $I_D$ in FIG. 3 can be increased by adding a current bleeder FET T5 as shown in FIG. 4. In FIG. 3

$$I_T = I_D + I_D$$

$$\therefore I_D = I_T/2$$

In FIG. 4

$$I_T + I_B = I_D + I_D$$

$$\therefore I_D = (I_T + I_B)/2$$

The $I_D$ of FIG. 4 is greater than the $I_D$ of FIG. 3 if $I_T$ is the same.

It therefore follows that if the current $I_D$ of FIG. 4 is greater than the current $I_D$ of FIG. 3 and if $I_T$ is the same, then the gain of the amplifier with the bleeder FET T5 in FIG. 4 must be greater than the gain of the amplifier in FIG. 3. A useful analysis of current bleeder, transconductance enhancement can be found on pages 288 and 289 of BI-POLAR AND MOS ANALOG INTEGRATED CIRCUIT DESIGN, Alan B. Grebene, John Wiley and Sons.

Figure 5:
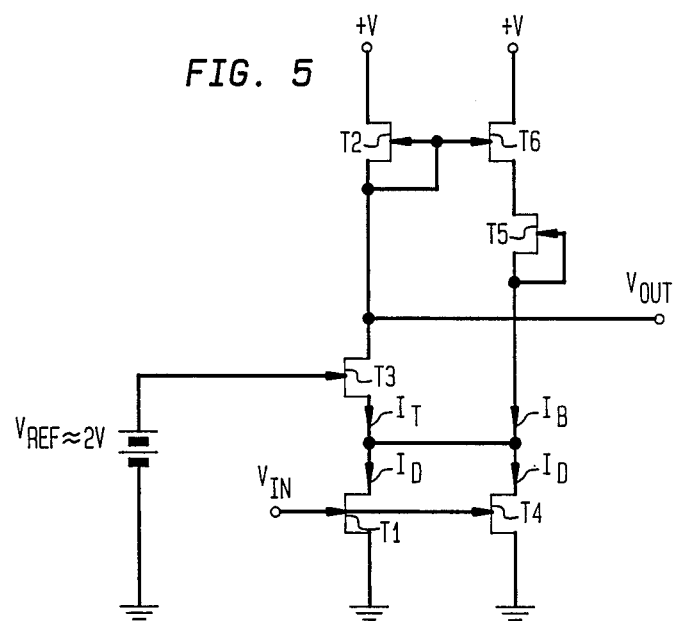
FIG. 5 illustrates the preferred embodiment of the present invention.
Figure 6:
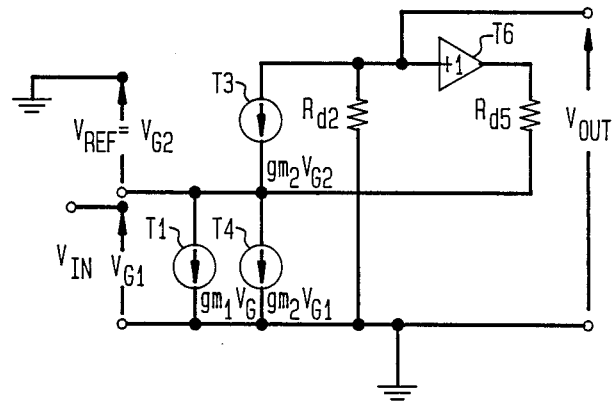
FIG. 6 illustrates an approximate equivalent circuit of the preferred embodiment of the invention as illustrated in FIG. 5.

The preferred embodiment of the invention shown in FIG. 5 comprises a technique for further increasing the gain of an FET amplifier beyond that possible by the techniques described in FIGS. 1 through 4. The improvement includes the use of a sixth FET T6 having a source connected to the drain of FET 5 and its drain connected to one terminal of the power supply $V_+$. The gate of FET T6 is connected to the amplifier output $V_{out}$ which is taken from the connection between the source of FET T2 and the drain of FET T3. T6 provides a positive feedback path to bleeder T5 and greatly increases the gain. In FIG. 4, the bleeder current $I_B$ is constant but in the improved circuit of FIG. 5, $I_B$ varies in response to the output voltage $V_{out}$. The approximate circuit equivalent for the preferred embodiment of the invention of FIG. 5 is illustrated in FIG. 6. The gain of FIG. 5 can then be given approximately by the following relationship:

$$\text{Gain} = \frac{V_{out}}{V_{in}} \approx R_d{}^2(G_{m1} + G_{m4})/(1 - R_{d2}/R_{d5})$$

assuming $G_m R_d >> 1$ for all FETS.

It can be seen from the foregoing that the gain of the circuit illustrated in FIG. 5 becomes very large when $R_{d2} = R_{d5}$.

The preferred embodiment of the invention shown in FIG. 5 can be altered by removing FETS T1 and T4 and replacing them with a single larger FET having twice the current carrying capacity. The invention is suitable for most depletion type FETS such as JFETS and IGFETS. While FETS T1, T3, T4 and T6 may be either depletion mode or enhancement mode FETS, it is important that FETS T2 and T5 be depletion mode only. Moreover, the circuit operates best when the characteristics of all the FETS are the same, however, at a minimum FETS T1, T2 and T3 should have the same characteristics and T4, T5 and T6 should have the same characteristics.

While the invention has been described with reference to the preferred embodiment thereof, it will be appreciated by those of ordinary skill in the art that modifications can be made to the elements and structure of the invention without departing from the spirit and scope thereof.

I claim:

1. An N-Channel JFET amplifer circuit apparatus having an input and an output and including a plurality of N-Channel JFETS each having a gate, a source and a drain, said amplifier circuit apparatus comprising:

a power supply having a first and a second terminal connected across said amplifier circuit apparatus;

a first N-Channel JFET having a gate connected to said input and a source connected to the second terminal of said power supply;

a second N-Channel JFET having a gate and a source connected to each other and a drain connected to the first terminal of said power supply;

a third N-Channel JFET having a drain connected to the source and gate of said second N-Channel JFET, a source connected to the drain of said first N-Channel JFET and a gate connected to a reference voltage;

a current bleeder means comprising a fourth N-Channel JFET having a source and a gate connected to each other and to the drain of said first N-Channel JFET; and, positive feedback means comprising a fifth N-Channel JFET having a drain connected to the first terminal of said power supply, a source connected to the drain of said fourth N-Channel JFET and a gate connected to the source and gate of said second N-Channel JFET.

2. The apparatus of claim 1 further comprising:

a sixth N-Channel JFET having a drain, source and gate connected respectively to the drain, source and gate of said first N-Channel JFET.

* * * * *